United States Patent [19]

Komaki

[11] Patent Number: 5,043,604

[45] Date of Patent: Aug. 27, 1991

[54] OUTPUT BUFFER CIRCUIT HAVING A LEVEL CONVERSION FUNCTION

[75] Inventor: Masaki Komaki, Kasugai, Japan

[73] Assignees: Fujitsu Limited, Kawasaki; Fujitsu VLSI Limited, Kasugai, both of Japan

[21] Appl. No.: 407,074

[22] Filed: Sep. 14, 1989

[30] Foreign Application Priority Data

Sep. 19, 1988 [JP] Japan .................. 63-234169

[51] Int. Cl.⁵ .............. H03K 19/092; H03K 19/094; H03K 19/086; H03K 19/003
[52] U.S. Cl. .................................. 307/475; 307/443; 307/451; 307/455
[58] Field of Search ............... 307/475, 443, 451, 481, 307/264, 594, 601, 605, 455

[56] References Cited

U.S. PATENT DOCUMENTS

| | | | |
|---|---|---|---|
| 4,450,371 | 5/1984 | Bismarck | 307/475 |
| 4,453,095 | 6/1984 | Wrathall | 307/475 |
| 4,563,601 | 1/1986 | Asano et al. | 307/475 |
| 4,779,013 | 10/1988 | Tanaka | 307/475 X |
| 4,890,019 | 12/1989 | Hoyte et al. | 307/451 |

FOREIGN PATENT DOCUMENTS 0275941 7/1988 European Pat. Off. .

OTHER PUBLICATIONS

Patent Abstracts of Japan, vol. 12, No. 221 (E-625) [3068], 23rd Jun. 1988; & JP-A-63 15 522 (NEC Corp.), 22-01-1988 *Whole Document*.

Primary Examiner—Stanley D. Miller
Assistant Examiner—David R. Bertelson
Attorney, Agent, or Firm—Armstrong, Nikaido, Marmelstein, Kubovcik, & Murray

[57] ABSTRACT

An output buffer circuit includes a prestage circuit which generates a first potential and a second potential (an intermediate voltage) based on the voltage of an input signal. The first potential is higher than the second potential. A final-stage circuit generates an output signal by controlling a current passing therethrough from a power source on the basis of the potential of the input terminal. The output signal is supplied to an ECL circuit through the output terminal. A control circuit generates a control signal during a predetermined time when a change in voltage of the input signal occurs. A bypass circuit sets the potential of the input terminal of the final-stage circuit lower than the second potential and discharging a parasitic capacitance coupled to the input terminal during the predetermined time defined by the control signal supplied from the control circuit when the prestage circuit outputs the second potential in response to a change in voltage of the input signal.

23 Claims, 7 Drawing Sheets

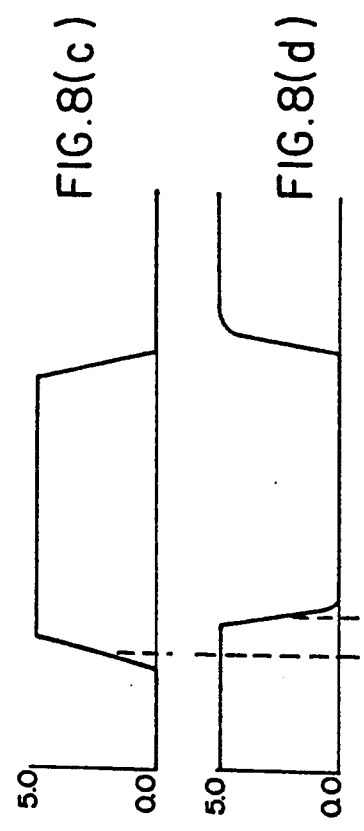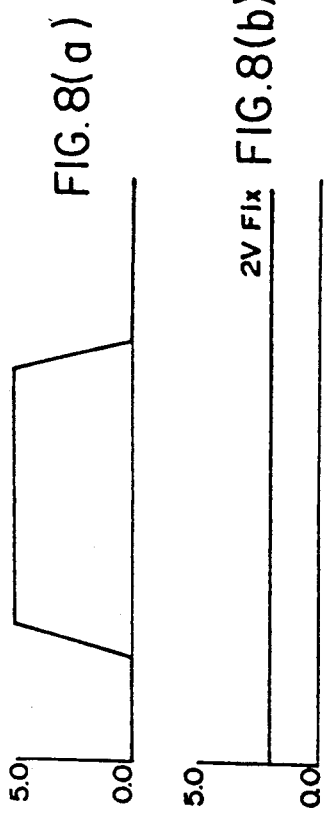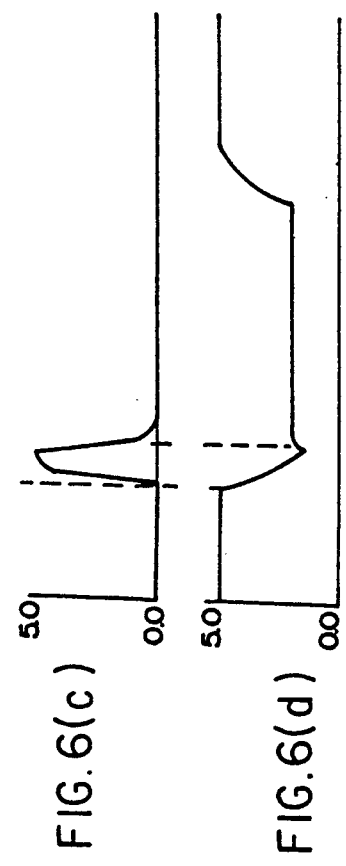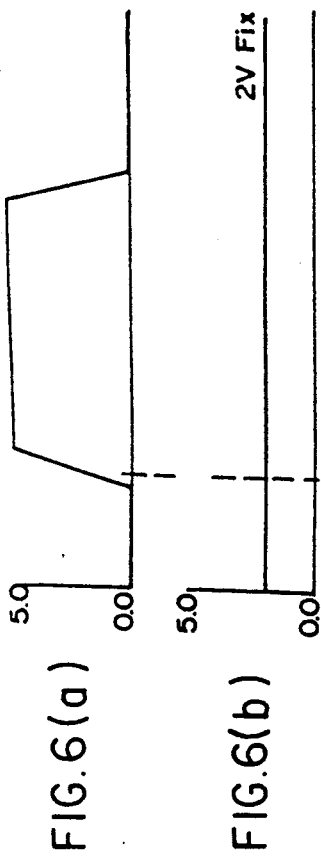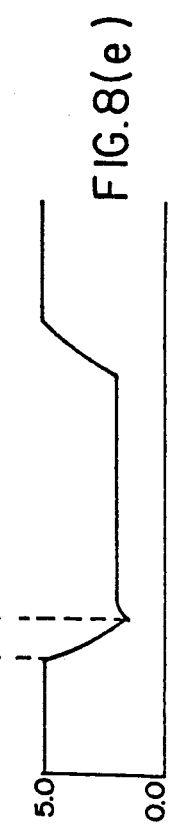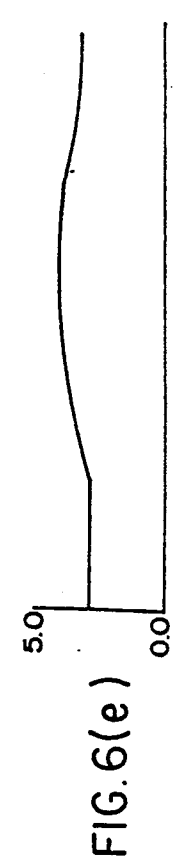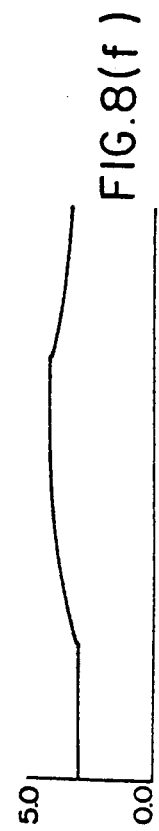

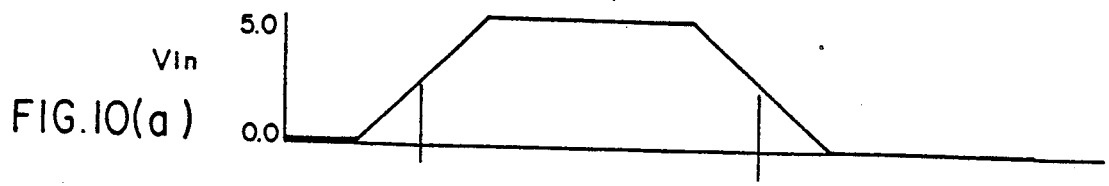
FIG.10(a) Vin
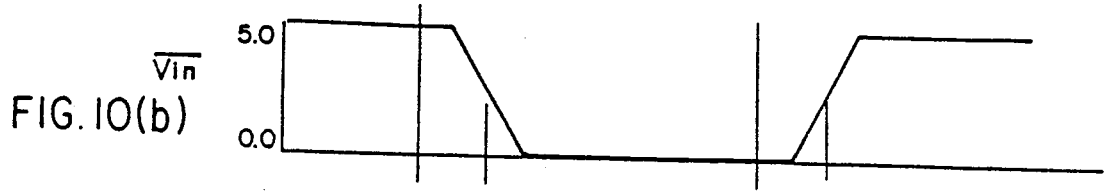
FIG.10(b) $\overline{Vin}$
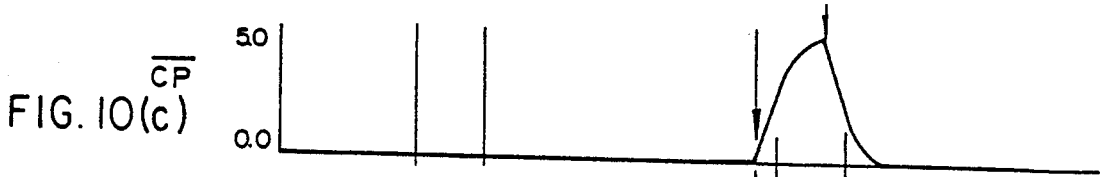
FIG.10(c) $\overline{CP}$
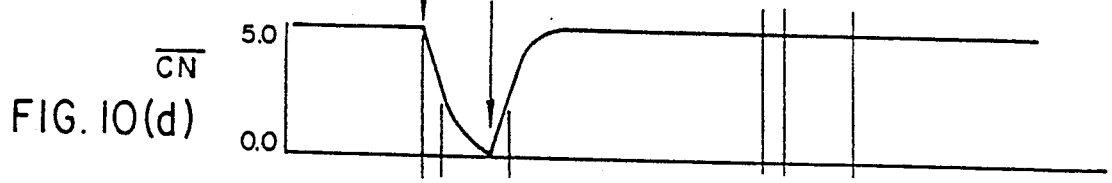
FIG.10(d) $\overline{CN}$
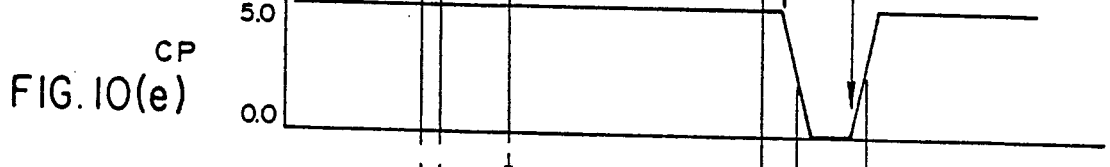
FIG.10(e) CP
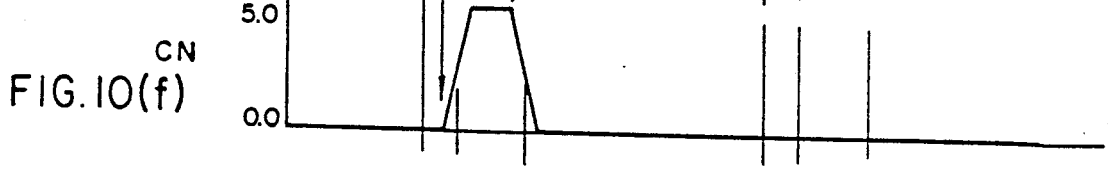
FIG.10(f) CN
FIG.10(g) Vo
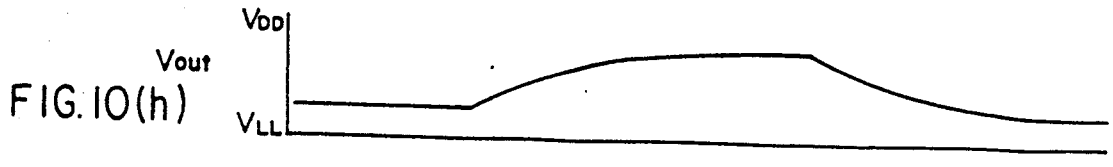
FIG.10(h) Vout

OUTPUT BUFFER CIRCUIT HAVING A LEVEL CONVERSION FUNCTION

BACKGROUND OF THE INVENTION

The present invention generally relates to an output buffer circuit having a level conversion function, and more particularly to an output buffer circuit having a CMOS/ECL (complementary metal oxide semiconductor/emitter coupled logic) level conversion function.

Conventionally, a CMOS LSI chip (or circuit) and an ECL LSI chip (or circuit) are connected to a common power source, as shown in FIG. 1. Each of the CMOS LSI chip and the ECL LSI chip is connected between a power source in line of 0 volt and a power source line of $-5.2$ volts. As is well known, the logic level potentials of a CMOS LSI are different from those for an ECL LSI. For example, a high level of CMOS logic is represented by a potential equal to 0 volt, and a low level of CMOS logic is represented by a potential equal to $-5.2$ volts. That is, the logic levels of CMOS LSI are defined by the power source voltages. On the other hand, a high level of ECL logic is represented by a potential equal to $-0.9$ volts, and a low level of ECL logic is represented by a potential equal to $-1.7$ volts, for example. That is, the logic levels of ECL LSI are different from the power source voltages. From the above-mentioned viewpoints, it is impossible to directly apply the logic level potentials of the CMOS LSI chip to the ECL LSI chip. In other words, the CMOS level potentials must be converted into the ECL level potentials in the CMOS LSI chip, and then applied to the ECL LSI chip. For this purpose, an output buffer circuit having a CMOS/ECL level conversion function is provided in the CMOS LSI chip, which generates a first potential and a second potential corresponding to the required high and low voltage levels for the ECL logic.

FIG. 2 is a circuit diagram of an open drain type output buffer circuit provided in a CMOS LSI chip. Referring to FIG. 2, the illustrated output buffer includes an intermediate voltage generating circuit 5 and an open drain circuit 6. Hereinafter, the intermediate generate voltage generating circuit 5 is referred to as a prestage circuit for the sake of simplicity. The prestage circuit 5 is made up of P-channel MOS transistors 7 and 10, and N-channel MOS transistors 8 and 9. Hereinafter, a P-channel MOS transistor is simply referred to as a PMOS transistor, and an N-channel MOS transistor is simply referred to as an NMOS transistor. The gates of the PMOS transistor 7 and the NMOS transistor 8 are supplied with an input voltage Vin derived from an CMOS logic circuit (not shown). A bias voltage $V_B$ equal to $-3$ volts for example, is applied to the gate of the NMOS transistor 9. The open drain circuit 6 includes an open-drain type PMOS transistor 11. An output voltage of the prestage circuit 5 is applied to the gate of the PMOS transistor 11. A power source voltage $V_{DD}$ is set equal to 0 volt, and a power source voltage $V_{SS}$ is set equal to $-5.2$ volts. A resistor RT connected between an output terminal OUT of the CMOS LSI chip and a line of a terminating voltage $V_{LL}$ corresponds to a resistance of an ECL circuit (50 ohms for example) to be connected to the output terminal OUT.

In order to generate the ECL level output voltages, the prestage circuit 5 can generate an intermediate voltage equal to $-3$ volts, for example. The value of the intermediate voltage is controlled by the bias volta $V_B$. When the input voltage Vin is at a low (L) level ($-5.2$ volts), the output voltage of the prestage circuit 5 is equal to the power source voltage $V_{DD}$ equal to 0 volt. At this time, the PMOS transistor 11 is OFF, and thus the potential Vout of the output terminal OUT is equal to $-1.7$ volts corresponding to the low Level of the ECL logic. On the other hand, when the input voltage Vin is at a high (H) level (0 volt), the output voltage of the prestage circuit 5 is set equal to the intermediate voltage equal to $-3$ volts. At this time, the PMOS transistor 11 is ON. When the gate voltage of the PMOS transistor 11 is $-3$ volts, volts, the ON resistance of the PMOS transistor 11 is approximately 40 ohms, for example. Thus, the power source $V_{DD}$ is divided by the ON resistance of the PMOS transistor 11 and the resistance RT. As a result, the potential Vout of the output terminal OUT is approximately equal to $-0.9$ volts. In this manner, the CMOS logic levels are converted into the ECL logic levels, which may be referred to as a first potential and a second potential.

However, the conventional output buffer circuit shown in FIG. 2 has the following disadvantages. It is noted that the operating speed of the output buffer circuit is based on charging and discharging speeds at which a parasitic capacitance (not shown) coupled to the gate of the PMOS transistor 11 is charged and discharged. When the input voltage Vin changes from L level to H level, a charge stored in the parasitic capacitance is allowed to pass through the NMOS transistors 8 and 9. However, since the NMOS transistor 9 is completely ON due to the bias voltage equal to $-3$ volts, it takes long to discharge the capacitance. Thus, it takes long the gate voltage of the NMOS transistor 11 to decrease to the intermediate potential equal to $-3$ volts. For this reason, the NMOS transistor 11 cannot operate at high speeds.

SUMMARY OF THE INVENTION

Accordingly, a general object of the present invention is to provide an improved output buffer circuit having a level conversion function in which the above-mentioned disadvantages of the conventional output buffer circuit shown in FIG. 2 are eliminated.

A more specific object of the present invention is to provide an output buffer circuit having a CMOS/ECL level conversion function capable of operating at extremely high speeds.

The above objects of the present invention can be achieved by an output buffer circuit comprising first means for generating a first potential and a second potential based on the voltage of an input signal, the first potential being higher than the second potential, second means having an input terminal coupled to the first means and an output terminal, for generating an output signal by controlling a current passing therethrough from a power source on the basis of the potential of the input terminal, the output signal being supplied to an external circuit through the output terminal, third means, coupled to the first means, for generating a control signal during a predetermined time when a change in voltage of the input signal occurs, and fourth means, coupled to the third means, for setting the potential of the input terminal of the second means lower than the second potential and discharging a parasitic capacitance coupled to the input terminal during the predetermined time defined by the control signal supplied from the third means when the first means outputs the second potential in response to a change in voltage of the input signal.

The aforementioned objects of the present invention can also be achieved by an output buffer circuit comprising first means for generating a first potential and a second potential based on the voltage of an input signal, the first potential being higher than the second potential, second means having an input terminal coupled to the first means and an output terminal, for generating an output signal by controlling a current passing therethrough from a power source on the basis of the potential of the input terminal, the output signal being supplied to an external circuit through the output terminal, third means, coupled to the first means, for generating first and second control signals from the input signal and the potential of the input terminal of the second means, the first and second control signals defining a predetermined time to be set when a change in voltage of the input signal occurs, and fourth means, coupled to the third means, for setting the potential of the input terminal of the second means lower than the second potential and discharging a parasitic capacitance coupled to the input terminal during the predetermined time defined by the first and second control signals supplied from the third means when the first means outputs the second potential in response to a change in voltage of the input signal.

The aforementioned objects of the present invention can also be achieved by an output buffer circuit comprising first means for generating a first potential and a second potential based on the voltage of an input signal, the first potential being higher than the second potential, second means having an input terminal coupled to the first means and an output terminal, for generating an output signal by controlling a current passing therethrough from a power source on the basis of the potential of the input terminal, the output signal being supplied to an external circuit through the output terminal, third means, coupled to the first means, for generating a first control signal from the input signal during a first predetermined time in response to a first change in voltage of the input signal and for generating a second control signal from the input signal during a second predetermined time in response to a second change in voltage of the input signal, and fourth means, coupled to the third means, for setting the potential of the input terminal of the second means lower than the second potential and discharging a parasitic capacitance coupled to the input terminal during the first predetermined time defined by the first control signal supplied from the third means, and for setting the potential of the input terminal of the second means equal to the first potential and charging the parasitic capacitance during the second predetermined time defined by the second control signal supplied from the third means.

Additional objects, features and advantages of the present invention will become apparent when read in conjunction with the accompanying drawings.

BRIEF DESCRIPTION OF THE DRAWINGS

FIG. 6 is a waveform diagram of signals at nodes in the configuration shown in FIG. 5;

FIG. 8 is a waveform diagram of signals at nodes in the configuration shown in FIG. 7;

FIG. 10 is a waveform diagram of signals at nodes in the configuration shown in FIG. 9.

DESCRIPTION OF THE PREFERRED EMBODIMENTS

Figure 3:
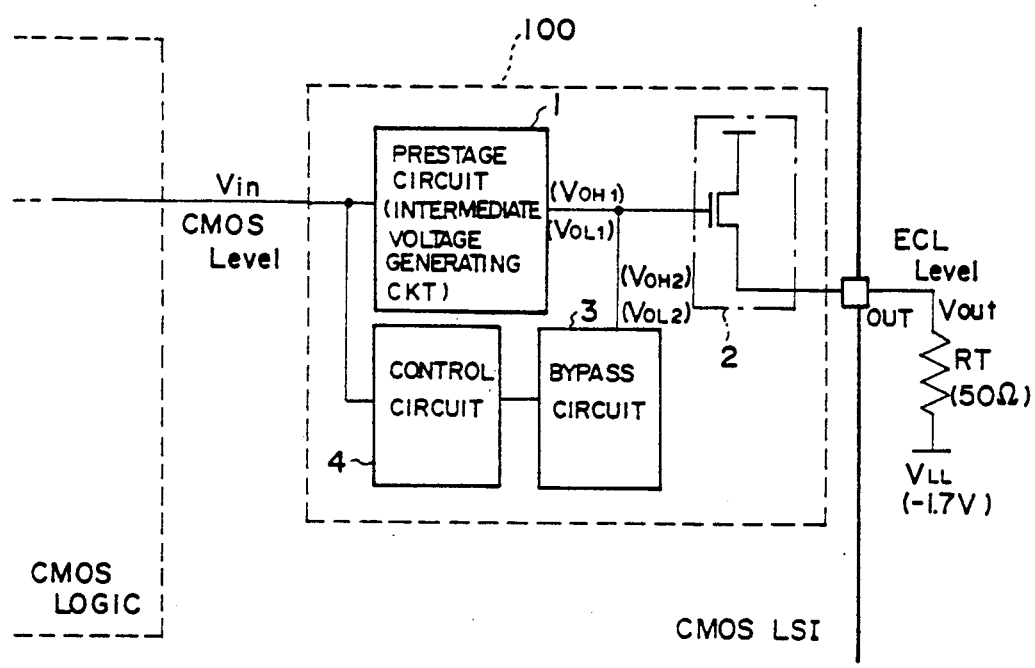
FIG. 3 is a block diagram illustrating the principle of the present invention.
Figure 4:
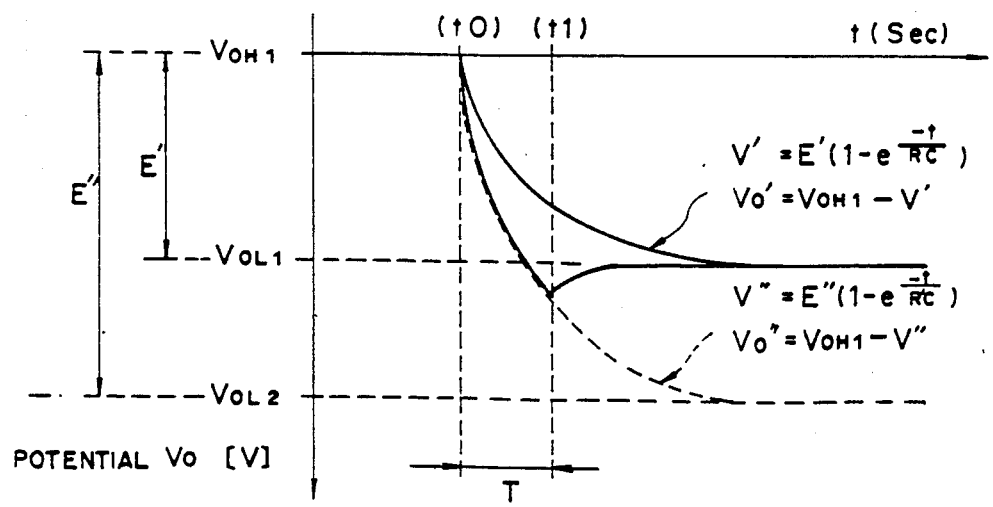
FIG. 4 is a waveform diagram of signals at nodes in the configuration shown in FIG. 3.

A description is given of the principle of the present invention with reference to FIGS. 3 and 4.

Referring to FIG. 3, an intermediate voltage generating circuit, or prestage circuit 1 can generate an intermediate voltage. A final-stage circuit 2 is formed by an open drain circuit or an analog circuit. According to the present invention, a control circuit 4 and a bypass circuit 3 connected in series are provided between the input and output terminals of the prestage circuit 1. The control circuit 4 outputs a control signal which makes the bypass circuit 3 active during a predetermined time, when a change of the input voltage Vin occurs. The bypass circuit 3 facilitates charging (additionally discharging, if necessary) the parasitic capacitance coupled to the input terminal of the final-stage circuit (the gate of the NMOS transistor) 2 while it is made active by the control circuit 4. For example, when the input voltage Vin changes from L level to H level, the control circuit 4 activates the bypass circuit 3. Thereby, the bypass circuit 3 provides a bypass line, through which the parasitic capacitance is rapidly discharged. Thereby, the final-stage circuit can rapidly respond to a change of the input voltage Vin. After the lapse of the predetermined time, the control circuit 4 makes the bypass circuit 3 inactive. Then, the output voltage of the prestage circuit 1 equal to the aforementioned intermediate voltage is applied to the input terminal of the final-stage circuit 2.

FIG. 4 is a waveform diagram illustrating the abovementioned operation. Symbols used in FIG. 4 are defined as follows. $V_{OH1}$ and $V_{OL1}$ are H and L levels of the output of the prestage circuit 1, respectively. $V_{OL2}$ is L level of the output of the bypass circuit 3. E' is the difference in potential between H and L levels of the prestage circuit 1 obtained in the steady state. E" is the difference in potential between H level of the prestage circuit 1 and L level of the bypass circuit 3 obtained in the steady state. V' is a change of the gate voltage (or the input voltage of the open gate circuit 2) caused by the prestage circuit 1 in the switching state. V" is a change of the gate voltage caused by the bypass circuit 3 in the switching state. Vo' and Vo" are output voltages of the prestage circuit 1 and the bypass circuit 3, respectively. R is an internal resistance of the prestage circuit 1, and R' is inernal resistance of the bypass circuit 3. C is a parasitic capacitance included in a wiring line connected to the output terminal OUT and the final-stage circuit 2 (or the parasitic capacitance coupled to the input terminal of the final-stage circuit 2), and t is time.

The voltages V' and Vo' are represented as follows:

$$V = E(1 - e^{-t/RC})$$

$$V_o' = V_{OH1} - V'$$

The voltages V″ and Vo″ are represented as follows:

$$V'' = E''(1 - e^{-t/R'C})$$

$$V_o'' = V_{OH1} - V''$$

During a time T, the control circuit 4 makes the bypass circuit 3 active so that the gate voltage decreases rapidly as shown in FIG. 4.

The control circuit 4 may activate the bypass circuit 3 when the input voltage Vin changes from H level to L level. At this time, the bypass circuit facilitates charging the parasitic capacitance. This will be described in detail later with reference to FIGS. 9 and 10.

Figure 1:
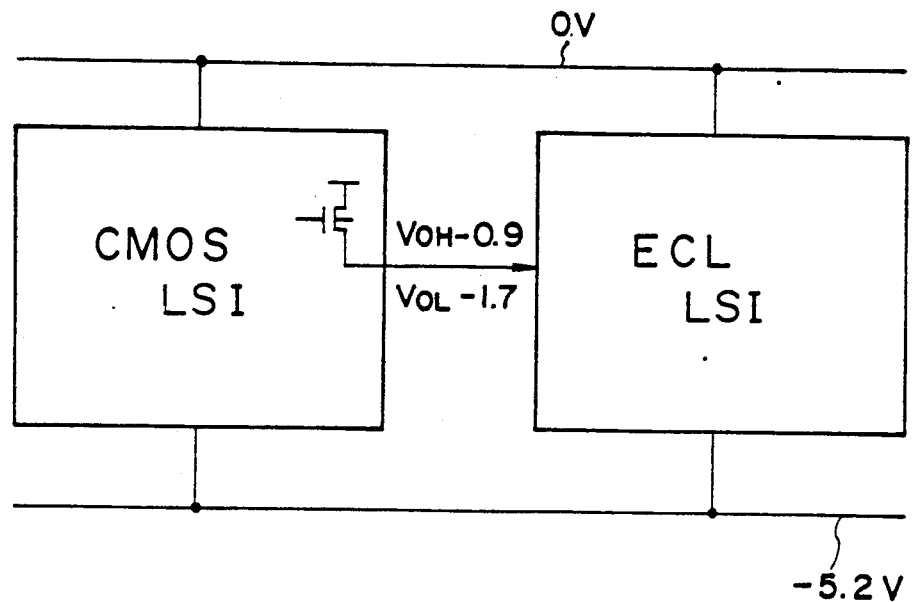
FIG. 1 is a block diagram of a circuit in which a CMOS LSI chip and an ECL LSI chip are connected to a common power source.
Figure 2:
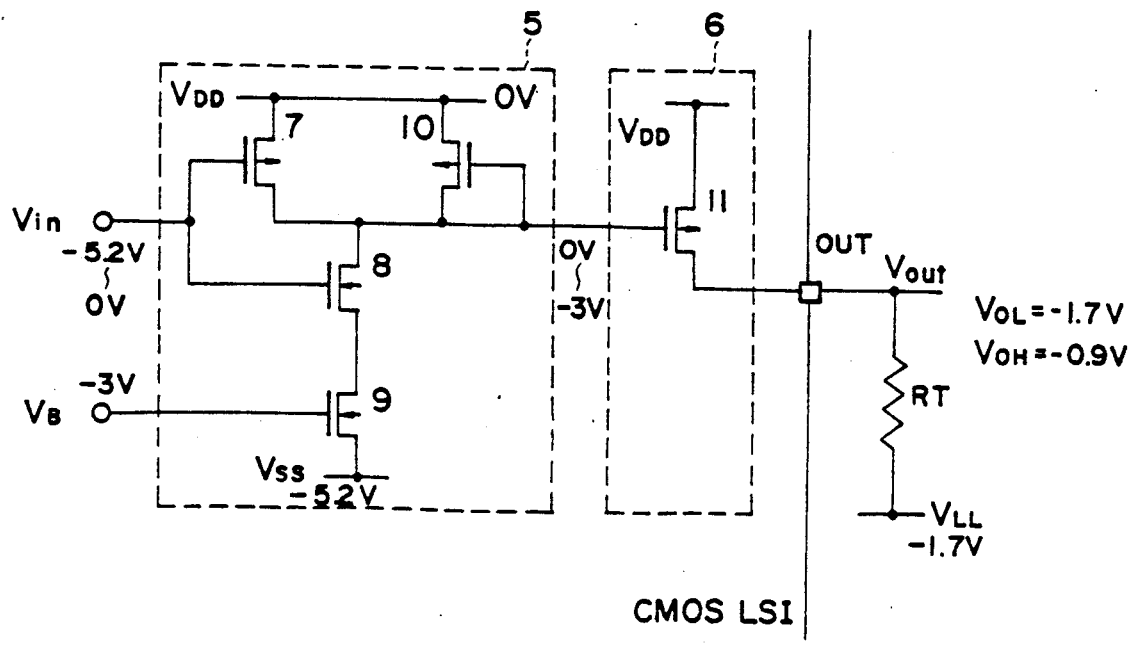
FIG. 2 is a circuit diagram of a conventional output buffer circuit provided in a CMOS LSI chip.
Figure 5:
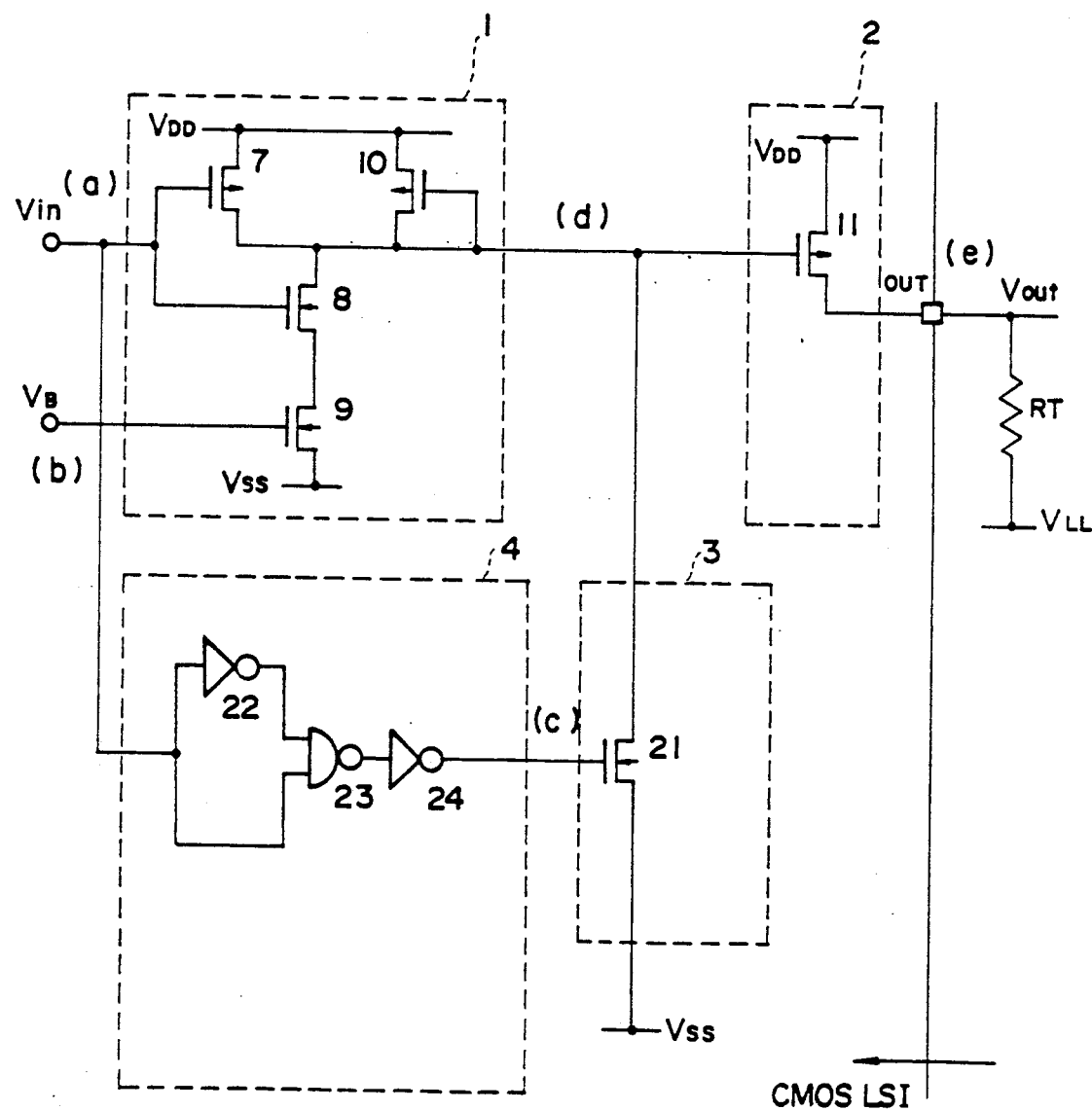
FIG. 5 is a circuit diagram of a first preferred embodiment of the present invention.

A description is given of a first preferred embodiment of the present invention with reference to FIGS. 5 and 6. Referring to FIG. 5, the prestage circuit (intermediate voltage generating circuit) 1 is made up of the PMOS transistors 7 and 10 and the NMOS transistors 8 and 9 in the same manner as the prestage circuit 5 shown in FIG. 2. The final-stage circuit 2 is formed by the PMOS transistor 11 in the same manner as the open drain circuit 6 shown in FIG. 2. The bypass circuit 3 is formed by an NMOS transistor 21, the drain of which is connected to the gate of the PMOS transistor 11. The source of the NMOS transistor 21 is connected to the power source $V_{SS}$, and the gate thereof is connected to the output terminal of the control circuit 4. The control circuit 4, which functions as a chopper circuit, is made up of an inverter 22, a NAND gate 23, and an inverter 24. The input voltage Vin derived from a CMOS logic circuit (not shown) is applied to the inverter 22, which serves as a delay element defining the duration time T shown in FIG. 4. The output terminal of the inverter 22 is connected to the NAND gate 23, which is directly supplied with the input voltage Vin. The output terminal of the NAND gate 23 is connected to the input terminal of the inverter 24, the output terminal of which is connected to the gate of the NMOS transistor 21.

A description is given of an operation of the first embodiment shown in FIG. 5 by referring to FIG. 6, which is a waveform diagram of signals obtained at nodes (a) through (e) shown in FIG. 5. In the following description, the power source voltage $V_{DD}$ is set equal to 5 volts, and the power source voltage $V_{SS}$ is set equal to 0 volt. Further, the bias voltage $V_B$ is set equal to 2 volts. When the input voltage Vin is equal to 0 volt (L level), the PMOS transistor 7 is ON and the NMOS transistor 8 is OFF. Thus, the potential of the node (d) or the output voltage of the prestage circuit 1 is equal to 5 volts (FIG. 6(d)). When the Vin is equal to 0 volt, the output voltage of the control circuit 4 is also 0 volt (FIG. 6(c)), and thus the NMOS transistor 21 of the bypass circuit 3 is OFF. In this state, the PMOS transistor 11 is OFF, and thus the potential Vout of the output terminal OUT is equal to the low level of the ECL logic (FIG. 6(e)).

When the input voltage Vin switches from L level (0 volt) to H level (5 volts), the output voltage of the control circuit 4 rises (FIG. 6(c)). Thus, the NMOS transistor 21 is turned ON and rapidly discharges the parasitic capacitance coupled to the gate of the PMOS transistor 11. Thereby, the potential at the node (d) is decreased at high speeds (FIG. 6(d)). Thus, the NMOS transistor 11 of the final-stage circuit can rapidly respond to the change of the input voltage Vin. Of course, the parasitic capacitance is discharged through the NMOS transistors 8 and 9.

When the output voltage of the inverter 22 changes from H level to L level, the output voltage of the control circuit 4 is switched to 0 volt (FIG. 6(c)), and thus the NMOS transistor 21 is turned OFF. At this time, the gate of the PMOS transistor 11 is supplied with the intermediate voltage derived from the prestage circuit 1. The value of the intermediate voltage is based on the value of the bias voltage $V_B$. The potential Vout of the output terminal OUT is obtained based on the ON resistance of the PMOS transistor 11 and the resistance RT.

It is preferable that an amount of delay provided by the delay element 22 is selected so that when the NMOS transistor 21 is turned ON, the potential at the node (d) is approximately equal to the intermediate voltage.

When the input voltage Vin changes from H level to L level, the output signal of the prestage circuit 1 is increased to the power source voltage $V_{DD}$. At this time, there is no change of the output signal of the control circuit 4 (FIG. 6(c)). Thus, the parasitic capacitance is charged through the PMOS transistor 7.

Figure 7:
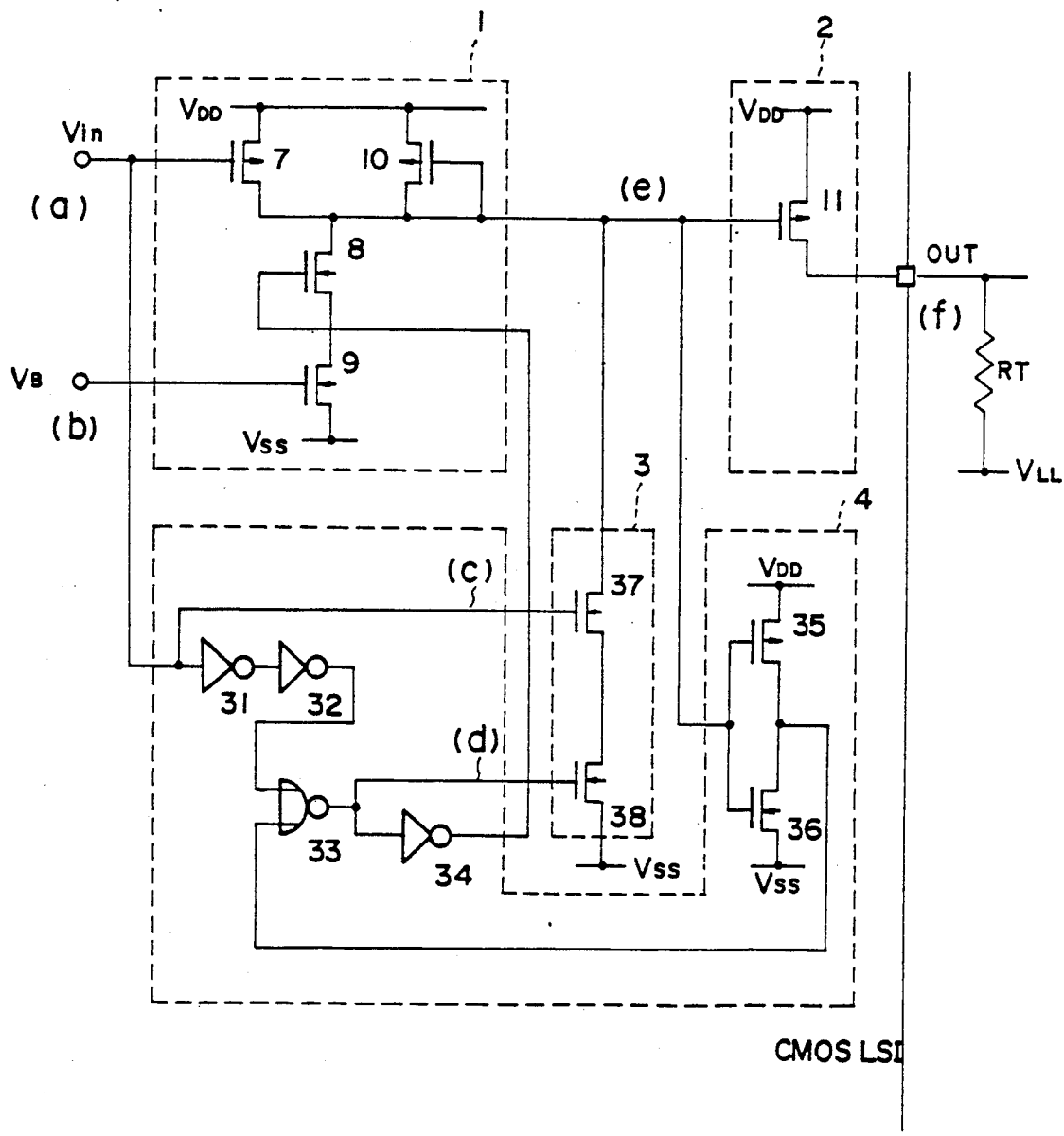
FIG. 7 is a circuit diagram of a second preferred embodiment of the present invention.

A description is given of a voltage feedback type output buffer circuit according to a second preferred embodiment of the present invention with reference to FIGS. 7 and 8. Referring to FIG. 7, the prestage circuit 1 and the final-stage circuit 2 are the same as those shown in FIG. 5. The bypass circuit 3 of the second embodiment is made up of two NMOS transistors 37 and 38. The drain of the NMOS transistor 37 is connected to the gate of the PMOS transistor 11 of the final-stage circuit 2. The input voltage Vin is directly applied to the gate of the NMOS transistor 37. The source of the NMOS transistor 37 and the drain of the NMOS transistor 38 are mutually connected. The source of the NMOS transistor 38 is connected to the power source $V_{SS}$.

The control circuit 4 is made up of inverters 31, 32 and 34, a NOR gate 33, a PMOS transistor 35 and an NMOS transistor 36. The input signal Vin passes through the series-connected inverters 31 and 32 which serve as a delay element, and is supplied to the NOR gate 33. The PMOS and NMOS transistors 35 and 36 form a CMOS inverter, which serves as a feedback circuit which generates a feedback signal by referring to the gate voltage of the PMOS transistor 11. The feedback signal is supplied to the NOR qate 33. The inverters 31 and 32 further function to prevent a malfunction of the feedback circuit which may occur in the steady state due to the logic state of the NOR gate 33. The output signal of the NOR gate 33 is supplied to the gate of the NMOS transistor 38 and the inverter 34. The output signal of the inverter 34 is supplied to the gate of the NMOS transistor 8 provided in the prestage circuit 1.

A description is given of an operation of the second embodiment shown in FIG. 7 by referring to FIG. 8, which is a waveform diagram of the signals obtained at nodes (a) through (f) shown in FIG. 7. When the input voltage Vin is equal to 0 volt (L level), the NMOS transistors 8, 37, and 38 are OFF, OFF and ON, respectively. When the input voltage Vin changes from L level to H level (5 volts) as shown in FIG. 8(a), the NMOS transistor 37 is turned ON (FIG. 8(c)), while the NMOS transistors 8 and 38 are held OFF and ON, respectively. Thereby, the bypass circuit 3 is made active, and a charge stored in the parasitic capacitance is allowed to pass through the NMOS transistors 37 and 38. Hence, the gate voltage of the PMOS transistor 11 of the final-stage circuit 2 decreases rapidly (FIG. 8(e)). In response to this change of the gate voltage, the feedback signal derived from the PMOS and NMOS transistors 35 and 36 changes from L level to H level. In response to this change of the feedback signal, the NMOS transistors 8, 37 and 38 are changed to ON, ON and OFF, respectively.

Figure 9:
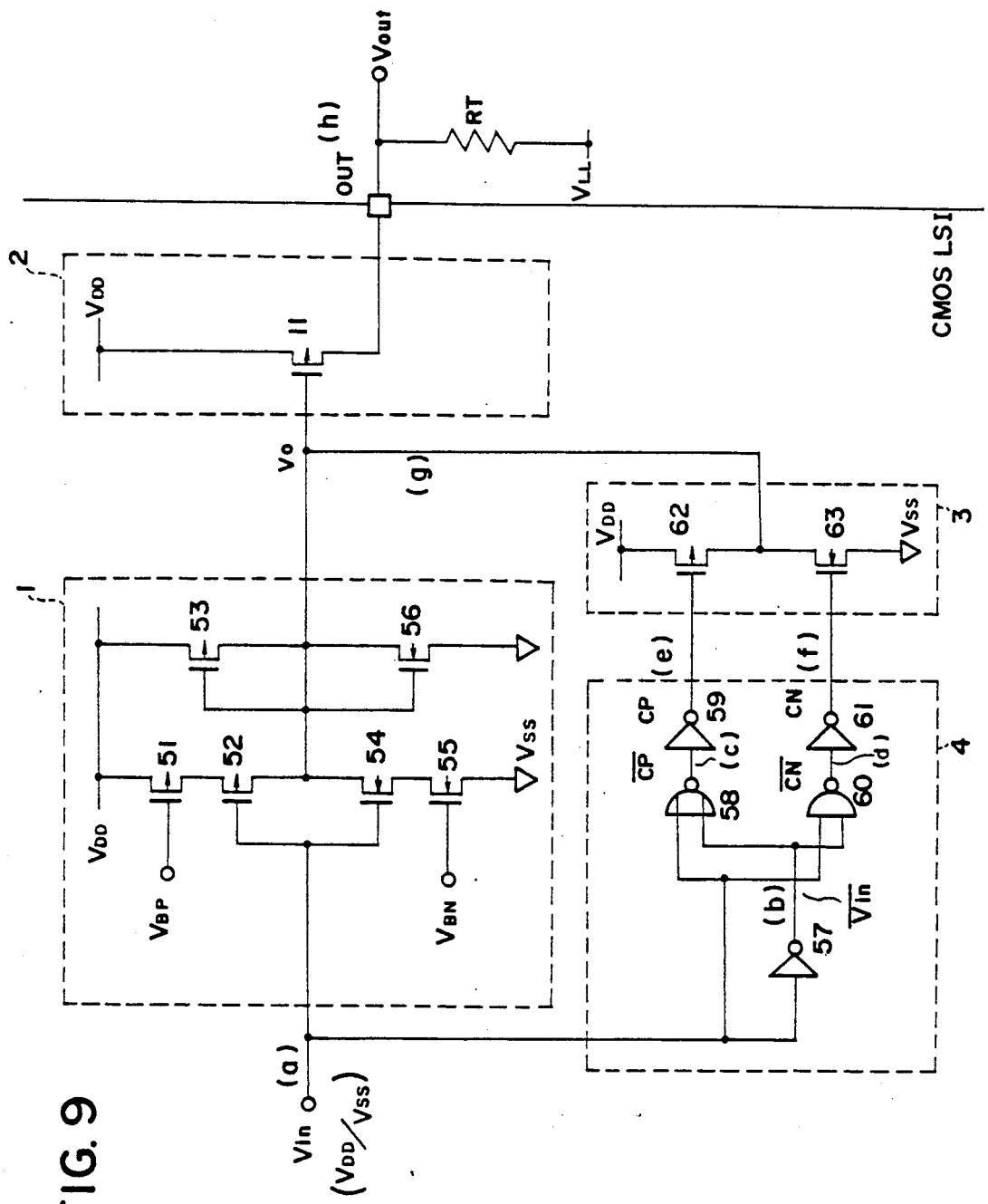
FIG. 9 is a circuit diagram of a third preferred embodiment of the present invention.

A description is given of a third embodiment of the present invention with reference to FIGS. 9 and 10. The third embodiment of the present invention is directed to facilitating not only the charging operation but also discharging operation. The intermediate voltage generating circuit or the prestage circuit 1 is made up of PMOS transistors 51, 52, and 53, and NMOS transistors 54, 55 and 56. The sources of the PMOS transistors 51 and 53 are connected to the power source $V_{DD}$. The drain of the PMOS transistor 51 is connected to the source of the PMOS transistor 52. The drain of the PMOS transistor 52 is connected to the drain of the NMOS transistor 54, the source of which is connected to the drain of the NMOS transistor 55. The drain of the NMOS transistor 55 is connected to the power source $V_{SS}$. The input voltage Vin is applied to the gates of the PMOS and NMOS transistors 52 and 54. A bias voltage $V_{BP}$ is applied to the gate of the PMOS transistor 51, and a bias voltage $V_{BN}$ is applied to the gate of the NMOS transistor 55. The bias voltage $V_{BP}$ is selected so that the PMOS transistor 51 can function as a constant current circuit, and is set equal to ($V_{DD}-1.5$ V), for example. The bias voltage $V_{BP}$ is selected so that the NMOS transistor 55 can function as a constant current circuit, and is set equal to ($V_{SS}+1.5$ V), for example. The drain and gate of the PMOS transistor 53 are mutually connected to the drain and gate of the NMOS transistor 56. The source of the PMOS transistor 53 is connected to the power source $V_{DD}$, and the source of the NMOS transistor 56 is connected to the power source $V_{SS}$. The prestage circuit 1 shown in FIG. 9 operates as follows. When the input voltage Vin is at L level, the PMOS transistor 52 is ON and the NMOS transistor 54 is OFF. In this state, current passes through the PMOS transistors 51 and 52 and the NMOS transistor 56 so that the output voltage $V_{OH1}$ is generated. On the other hand, when the input voltage Vin is at H level, the PMOS transistor 52 is OFF and the NMOS transistor 54 is ON. In this state, current passes through the PMOS transistor 53, and the NMOS transistors 54, 55 and 56 so that the output voltage $V_{OL1}$ of the prestage circuit 1 is generated. It is noted that the prestage circuit 1 functions as a constant current circuit, and therefore the driveability of charging and discharging operation at the time of switching is poor.

The final-stage circuit 2 is formed by the open drain PMOS transistor 11 in the same manner as the final-stage circuit 2 of the first or second embodiment.

The bypass circuit 3 is made up of a PMOS transistor 62 and an NMOS transistor 63, which form a push-pull inverter. The source of the PMOS transistor 62 is connected to the power source $V_{DD}$, and the source of the NMOS transistor 63 is connected to the power source $V_{SS}$. The mutually connected drains of the PMOS and NMOS transistors 62 and 63 are connected to the gate of the PMOS transistor 11 of the final-stage circuit 2.

The control circuit 4 is made up of inverters 57, 59 and 61, a NOR gate 58, and a NAND gate 60. The input voltage Vin is applied to the NOR gate 58 and the NAND gate 60. Further, the input voltage Vin is applied to the inverter 57, the output of which is supplied to the NOR gate 58 and the NAND gate 60. The NOR gate 58 generates a pulse signal $\overline{CP}$. The inverter 59 inverts the pulse signal $\overline{CP}$ and outputs a pulse signal CP, which is supplied to the gate of the PMOS transistor 62. The NAND gate 60 generates a pulse signal $\overline{CN}$. The inverter 61 inverts the pulse signal $\overline{CN}$ and outputs a pulse signal CN, which is supplied to the gate of the NMOS transistor 63. When the input voltage Vin rises, the inverter 61 outputs the pulse signal CN. When the input voltage Vin falls, the inverter 59 outputs the pulse signal CP.

A description is given of an operation of the third embodiment shown in FIG. 9 by referring to FIG. 10, which is a waveform diagram of signals obtained at nodes (a) through (h) shown in FIG. 9. When the input voltage Vin rises (FIG. 10(a)), the output voltage Vo of the prestage circuit 1 starts decreasing as indicated by a broken line shown in FIG. 10(g). Immediately after the output voltage Vo starts decreasing, the control circuit 4 outputs the pulse signal CN through the inverter 61 (FIG. 10(f)). Thereby the NMOS transistor 63 of the bypass circuit 3 is held ON while the pulse signal CN is output. The NMOS transistor 63 functions to decrease the voltage Vo to the power source voltage $V_{SS}$, so that the voltage Vo can rapidly decrease as shown in FIG. 10(g). Thereby the PMOS transistor 11 of the final-stage circuit 2 can rapidly respond to the L-to-H change of the input voltage Vin.

When the input voltage falls, the output voltage Vo of the prestage circuit starts increasing as indicated by a broken line shown in FIG. 10(g). Immediately after the output voltage Vo starts increasing, the control circuit 4 outputs the pulse signal CP (FIG. 10(e)). Thereby the PMOS transistor 62 of the bypass circuit 3 is held ON while the pulse signal CP is output. The PMOS transistor 62 functions to increase the voltage Vo to the power source voltage $V_{DD}$, so that the voltage Vo can rapidly increase as shown in FIG. 10(g). Thereby the PMOS transistor 11 of the final-stage circuit 2 can rapidly respond to the H-to-L change of the input voltage Vin.

The present invention is not limited to the aforementioned embodiments, and variations and modifications may be made without departing from the claimed invention.

What is claimed is:

1. An output buffer circuit comprising:
   first means for generating a first potential and a second potential based on the voltage of an input signal, said first potential being higher than said second potential;
   second means having an input terminal coupled to said first means and an output terminal, for generating an output signal by controlling a first current passing therethrough from a power source on the basis of the potential of said input terminal, said output signal being supplied to an external circuit through said output terminal;
   third means, coupled to said first means, for generating a control signal during a predetermined time when a change in voltage of said input signal occurs; and
   fourth means, coupled to said third means, for setting the potential of said input terminal of said second means lower than said second potential and discharging a parasitic capacitance coupled to said input terminal during the predetermined time defined by said control signal supplied from said third means when said first means outputs said second potential in response to a change in voltage of said input signal.

2. An output buffer circuit as claimed in claim 1, wherein said fourth means includes a MOS transistor having a gate terminal and first and second terminals, and wherein said control signal is supplied to the gate terminal of the MOS transistor, and said first terminal is connected to a second power source and said second terminal is connected to an input terminal of said second means.

3. An output buffer circuit as claimed in claim 1, wherein said third means includes delay means for delaying said input signal by said predetermined time and for outputting a delayed signal, and means for generating said control signal from said input signal and said delayed signal.

4. An output buffer circuit as claimed in claim 3, wherein said delay means includes an inverter, and said gate means includes a NAND gate and an inverter.

5. An output buffer circuit as claimed in claim 1, wherein said second means includes an open drain MOS transistor having a gate, a drain and a source, and said gate forms said input terminal of said second means, and wherein the drain of said open drain MOS transistor forms said output terminal of said second means, and said source thereof is connected to said first power source.

6. An output buffer circuit as claimed in claim 1, wherein said input signal is a CMOS level signal, and said output signal is an ECL level signal.

7. An output buffer circuit as claimed in claim 1, wherein said input signal is a CMOS level signal, and said second potential is between a high potential corresponding to a high level of the CMOS logic and a low potential corresponding to a low level of the CMOS logic.

8. An output buffer circuit comprising:
first means for generating a first potential and a second potential based on the voltage of an input signal, said first potential being higher than said second potential;
second means having an input terminal coupled to said first means and an output terminal, for generating an output signal by controlling a current passing therethrough from a first power source on the basis of the potential of said input terminal, said output signal being supplied to an external circuit through said output terminal;
third means, coupled to said first means, for generating first and second control signals from said input signal and said potential of said input terminal of said second means, said first and second control signals defining a predetermined time to be set when a change in voltage of said input signal occurs; and
fourth means, coupled to said third means, for setting the potential of said input terminal of said second means lower than said second potential and discharging a parasitic capacitance coupled to said input terminal during the predetermined time defined by said first and second control signals supplied from said third means when said first means outputs said second potential in response to a change in voltage of said input signal.

9. An output buffer circuit as claimed in claim 8, wherein said fourth means includes first and second MOS transistors which are connected in series between said input terminal of said second means and said power source, and wherein said first and second control signals are supplied to gates of said first and second MOS transistors, respectively.

10. An output buffer circuit as claimed in claim 9, wherein said third means includes CMOS inverter means for generating a feedback signal from the potential of said input terminal of said second means, delay means for delaying said input signal by said predetermined time and outputting a delayed signal, and gate means for generating said second control signal from said feedback signal and said delayed signal, and wherein said input signal is supplied, as said first control signal, to the gate of said first MOS transistor, and said second control signal derived from said gate means is supplied to the gate of said second MOS transistor.

11. An output buffer circuit as claimed in claim 10, wherein said delay means includes an inverter, and said gate means includes a NOR gate.

12. An output buffer circuit as claimed in claim 8, wherein said second means includes an open drain MOS transistor having a gate, a drain and a source, and said gate forms said input terminal of said second means, and wherein the drain of said open drain MOS transistor forms said output terminal of said second means, and said source thereof is connected to said first power source.

13. An output buffer circuit as claimed in claim 8, wherein said input signal is a CMOS level signal, and said output signal is an ECL level signal.

14. An output buffer circuit as claimed in claim 8, wherein said input signal is a CMOS level signal, and said second potential is between a high potential corresponding to a high level of the CMOS logic and a low potential corresponding to a low level of the CMOS logic.

15. An output buffer circuit comprising:
first means for generating a first potential and a second potential based on the voltage of an input signal, said first potential being higher than said second potential;
second means having an input terminal coupled to said first means and an output terminal, for generating an output signal by controlling a current passing therethrough from a power source on the basis of the potential of said input terminal, said output signal being supplied to an external circuit through said output terminal;
third means, coupled to said first means, for generating a first control signal from said input signal during a first predetermined time in response to a first change in voltage of said input signal and for generating a second control signal from said input signal during a second predetermined time in response to a second change in voltage of said input signal; and
fourth means, coupled to said third means, for setting the potential of said input terminal of said second means lower than said second potential and discharging a parasitic capacitance coupled to said input terminal during the first predetermined time defined by said first control signal supplied from said third means, and for setting the potential of said input terminal of said second means equal to said first potential and charging said parasitic capacitance during said second predetermined time defined by said second control signal supplied from said third means.

16. An output buffer circuit as claimed in claim 15, wherein said fourth means includes a PMOS transistor having a gate supplied with said second control signal, a source connected to said first power source, and a drain connected to the input terminal of said second means, and an NMOS transistor having a gate supplied with said first control signal, a source connected to said second power source, and a drain connected to said input terminal of said second means.

17. An output buffer circuit as claimed in claim 15, wherein said third means includes delay means for delaying said input voltage and outputting a delayed signal, first gate means for generating said first control signal from said input signal and said delayed signal, and second gate means for generating said second control signal from said input signal and said delayed signal.

18. An output buffer circuit as claimed in claim 17, wherein said delay means includes an inverter.

19. An output buffer circuit as claimed in claim 17, wherein said first gate means includes NAND gate means for receiving said input signal and said delayed signal and outputting a NAND gate signal, and inverter means for inverting said NAND gate signal to thereby output said first control signal.

20. An output buffer circuit as claimed in claim 17, wherein said second gate means includes NOR gate means for receiving said input signal and said delayed signal and outputting a NOR gate signal, and inverter means for inverting said NOR gate signal to thereby output said second control signal.

21. An output buffer circuit as claimed in claim 15, wherein said second means includes an open drain MOS transistor having a gate, a drain and a source, and said gate forms said input terminal of said second means, and wherein the drain of said open drain MOS transistor forms said output terminal of said second means, and the source thereof is connected to said first power source.

22. An output buffer circuit as claimed in claim 15, wherein said input signal is a CMOS level signal, and said output signal is an ECL level signal.

23. An output buffer circuit as claimed in claim 15, wherein said input signal is a CMOS level signal, and said second potential is between a high potential corresponding to a high level of the CMOS logic and a low potential corresponding to a low level of the CMOS logic.

* * * * *